United States Patent
Schwirtlich et al.

(10) Patent No.: US 7,253,355 B2
(45) Date of Patent: Aug. 7, 2007

(54) METHOD FOR CONSTRUCTING A LAYER STRUCTURE ON A SUBSTRATE

(75) Inventors: Ingo Schwirtlich, Miltenberg (DE); Wilfried Schmidt, Schwaigern (DE); Hilmar von Campe, Bad Homburg (DE)

(73) Assignee: RWE Schott Solar GmbH, Alzenau (DE)

( * ) Notice: Subject to any disclaimer, the term of this patent is extended or adjusted under 35 U.S.C. 154(b) by 539 days.

(21) Appl. No.: 10/322,762

(22) Filed: Dec. 19, 2002

(65) Prior Publication Data

US 2003/0121545 A1   Jul. 3, 2003

(30) Foreign Application Priority Data

Dec. 20, 2001  (DE) .............................. 101 63 100
Feb. 12, 2002  (EP) .............................. 02003042

(51) Int. Cl.
*H01L 31/0216* (2006.01)
*B05D 3/02* (2006.01)

(52) U.S. Cl. ...................... 136/256; 136/251; 136/252; 136/261; 136/258; 136/262; 136/265; 438/64; 438/69; 438/97; 438/93; 438/95; 427/372.2; 427/379; 427/380; 427/383.3

(58) Field of Classification Search ................ 136/256, 136/251, 252, 261, 258, 262, 265; 438/64, 438/69, 97, 93, 95; 427/372.2, 379, 380, 427/383.3, 397.7, 384, 74
See application file for complete search history.

(56) References Cited

U.S. PATENT DOCUMENTS

| | | | |
|---|---|---|---|
| 2,874,341 A * | 2/1959 | Biondi et al. ............... | 257/772 |
| 3,338,693 A * | 8/1967 | Letter ........................ | 65/17.3 |
| 3,653,970 A * | 4/1972 | Iles ............................ | 136/256 |
| 4,320,251 A * | 3/1982 | Narasimhan et al. ....... | 136/256 |
| 5,151,386 A * | 9/1992 | Bottari et al. ................ | 438/98 |
| 5,290,832 A * | 3/1994 | Schwerzel et al. ........... | 524/56 |
| 5,552,351 A * | 9/1996 | Anderson et al. ............ | 501/81 |
| 5,616,185 A * | 4/1997 | Kukulka ..................... | 136/244 |
| 5,776,235 A | 7/1998 | Camilletti et al. | |
| 6,093,882 A * | 7/2000 | Arimoto ..................... | 136/252 |

(Continued)

FOREIGN PATENT DOCUMENTS

DE            19930043 A1 *   1/2001

(Continued)

OTHER PUBLICATIONS

Eyer et al, "Crystalline Silicon Thin-Film (CSiTF) Solar Cells on SSP and Ceramic Substrates", Journal of Crystal Growth, May 2005, pp. 340-347.

(Continued)

*Primary Examiner*—Kishor Mayekar
(74) *Attorney, Agent, or Firm*—Dennison, Schultz & MacDonald

(57) ABSTRACT

The invention relates to a method for constructing a layer structure on an especially fragile flat substrate. In order for thin, fragile flat substrates to be able to be subjected to refinement or construction of semiconductor components, a process is proposed with the steps: Applying an inorganic ceramic phase to the fragile substrate and subsequent heat treatment for hardening and sintering the inorganic ceramic material.

31 Claims, 6 Drawing Sheets

U.S. PATENT DOCUMENTS

| | | | |
|---|---|---|---|
| 6,127,202 A | * | 10/2000 | Kapur et al. .................. 438/47 |
| 6,150,605 A | * | 11/2000 | Han ........................... 136/263 |
| 6,358,567 B2 | | 3/2002 | Pham et al. |
| 6,649,824 B1 | * | 11/2003 | Den et al. ................... 136/256 |

FOREIGN PATENT DOCUMENTS

| | | | |
|---|---|---|---|
| EP | 1321446 A1 | * | 6/2003 |
| JP | 63-265872 A | * | 12/1988 |
| JP | 05251724 | | 9/1993 |
| JP | 05283727 | | 10/1993 |
| JP | 06334205 | | 12/1994 |
| JP | 2000327460 | | 11/2000 |
| JP | 2004-128411 A | * | 4/2004 |

OTHER PUBLICATIONS

Van Roosmalen et al, "Ceramic Substrates for Thin-Film Crystalline Solar Cells", IEEE, 25th PVSC, 1996, pp. 657-660.

* cited by examiner

METHOD FOR CONSTRUCTING A LAYER STRUCTURE ON A SUBSTRATE

BACKGROUND OF THE INVENTION

The invention relates to a method for constructing a layer structure on an especially fragile flat substrate. Furthermore, the invention relates to a solar cell as well as to the use of an inorganic ceramic material.

The construction of layer structures in macroscopic as well as in microscopic bodies is sufficiently known. Laminates in the furniture and construction material industry or corrosion-resistant coatings of metals can be mentioned as examples.

Constructing coatings to increase surface hardness to diminish the wear and tear of components in machines is also known.

Coatings are applied and burned in for configuring the surface of tiles in the ceramics industry.

Sheet steel can be enameled in order to make it resistant toward chemical influences and mechanical attacks. At the same time, there results a correspondingly configured surface.

Layer constructions are known from microelectronics in which the individual layers are structured photolithographically and epitaxially generated through gas phases. Functional components are generated as a rule through typical epitaxy layers. Here as a rule polished semiconductor disks serve as substrates which are built up layer by layer.

Applying electrically active layers on the basis of silicon or comparable semiconductors to ceramic substrates is known in the area of solar cell production. With the method particularly coming into use it is a matter of gas phase epitaxy or liquid phase epitaxy in which, for example, molten silicon is applied to ceramic substrates.

According to another method, layers applied to ceramic substrates are subsequently crystallized in order to improve the electrical properties. In the area of photovoltaics these processes serve to spare expensive semiconductor materials or replacing them through more costly ceramics.

The previously known approaches to reducing the thickness of photoelectric layers proceed from a supporting substrate on which the semi-conducting material is built up in the form of one or more layers to form the solar cell though various methods.

Reducing manufacturing costs is of extraordinary significance in order for the photovoltaics to succeed economically. In comparison with electrical energy generated with conventional means, energy obtained from sunlight through solar cells is still too expensive. Material costs contribute a basic amount to this.

Photovoltaics on the basis of monocyrstalline or multicrystalline silicon delivers very good energy transformation effectiveness from sunlight into electrical current in comparison with solar cells from thin photoactive layers which are built up on substrates. The material cost component is moreover primarily determined by the price of monocrystalline or multicrystalline silicon disks. Therefore obtaining disk thicknesses as thin as possible is sought in order to reduce costs. But increasing breakage rates during processing into a solar cell and subsequently to a module goes along with reducing layer thicknesses. The later a disk breaks in a production sequence, the greater the lost added value.

With multicrystalline silicon disks, those obtained from casting a block and subsequent sawing are differentiated from those which are directly crystallized on the basis of the melts as bands or in the form of tubes, for example according to the EFG method (edge-defined film-fed growth). The behavior of these materials is nonetheless different under mechanical loads. As stable a handling as possible with usual methods is necessary for further processing in order to attain a high added value by reducing breakdowns. This in particular applies for thin silicon disks. This is also significant if materials of different manufacture are to be processed with one and the same production line.

SUMMARY OF THE INVENTION

The present invention is based upon the problem of refining a method of the type mentioned at the beginning such that thin, fragile flat substrates can be subjected to processes for finishing or construction of semiconductor components such as solar cells to the desired extent, whereby there should be an economical protection against breakage and deformation.

The problem is basically solved in accordance with the method for constructing a layer structure on an especially fragile flat substrate by the steps:

Applying an inorganic ceramic material to the fragile substrate and

Subsequent heat treatment for hardening and sintering the inorganic ceramic mass.

In accordance with the method, a fragile substrate is provided with an economical inorganic ceramic material of high hardness owing to which the substrate received the requisite hardness so that a protection against breakage and deformation exists. In particular, mechanical strength of metal substrates consisting of silicon, germanium, gallium arsenide and cadmium telluride can be increased by the method of the invention. At the same time, the inorganic ceramic material can be composed such that a selective doping of semi-conducting substrates with atoms or ions takes place in order, for example, to construct special pn-transitions, for example as diode structures as protective diodes in the semi-conducting substrate.

Consequently, parallel to increasing the breaking strength, a selective doping of the substrate can take place in order to attain the desired electrical properties. Therefore, a preferred area of application of the theory of the invention is also the area of solar cells, whereby substrates in the form of thin disks of silicon, gallium arsenide, germanium, cadmium telluride or other group IV semiconductors of the periodic system or combination semiconductors from groups III and V or II and VI used for photo-voltaics.

Moreover, the inorganic ceramic material forming the mechanical reinforcement can be applied in the process flow beginning with the unprocessed semiconductor disk up to the finished solar cell. Owing to the applied inorganic ceramic material, the finished processed cell has a greater stability during the further processing steps up to the module.

The inorganic ceramic material can, for example, be applied by means of screen printing, tampon printing, stretching or spraying. There also exists the possibility of applying the inorganic substrate ceramic material using positioning and pressing upon the metal substrate.

According to a refinement of the invention, it is anticipated that the substrate can only be provided area-wise with the inorganic material. Thus the ceramic material can enclose the substrate like a frame. The construction of a lattice structure or recesses in an otherwise flat application can also be provided.

Independently of this, the inorganic ceramic mass can have a thickness D with 10 μm≦D≦500 μm, especially 100 μm≦D≦300 μm. The thickness relates to the hardened material.

Furthermore, the composition of the inorganic ceramic material should be selected such that the coefficient of expansion of the hardened material almost corresponds to the order of magnitude of the substrate.

It is proposed according to one configuration of the invention to work the inorganic ceramic material into a fabric or into fibers. Fabrics of $SiO_2$, SiC or C fibers come into question as fabrics. Metal wires or silicon fibers can also be used which have the inorganic ceramic material. Polyethylene, polyurethane or textile fibers can also be mentioned as organic fibers which can be used.

Silicon dioxide, aluminum, aluminum oxide, aluminum diboride, magnesium oxide, silicon nitride, lithium boride, sodium oxide, lithium oxide, cerium oxide, yttrium oxide, boron oxide, boron nitride, silicon carbide, metallurgical silicon or graphite or mixtures of these can be used as preferred inorganic ceramic materials, whereby individual components or mixtures of these can be mixed with an organic binding agent and in particular a sinter adjuvant.

The inorganic ceramic material can moreover have a paste-like consistency or be a dispersion.

The heat treatment step of inorganic ceramic material and the substrate where it can also be a matter of a substrate already subjected to process steps is to be conducted such that a sintering takes place. For this, the substrate is exposed with the inorganic ceramic material to a temperature $T_1$ at especially 600° C.≦$T_1$≦1,650° C., preferably 750° C.≦$T_1$≦950° C. until the organic material is hardened and sintered. Preferably, however, before expelling moisture or solvent, a heat pretreatment takes place at a temperature $T_2$ at 50° C.≦$T_2$≦500° C., preferably 100° C.≦$T_2$≦300° C., whereby an oxidizing and/or inert atmosphere can prevail in this step. The formation of cracks during the sintering process is in particular avoided through this pretreatment step.

In particular cases, the local heating up of areas with ceramic paste can be necessary. Moreover, a local heating up of the paste using lasers is possible so that the entire disk is not acted upon by heat. The laser beam is scanned over the spots on the sample to be heated. In this way, the ceramic material is sintered under the heat action of the laser.

A local heating up of the paste can also take place with a focused light source as a point light source or a linear point source especially if the edge area is to be heat-treated. The lamp focus is positioned over the spots of the sample to be heated.

The sinter temperature basically comes to 600° C. to 1350° C., for a short time up to 1650° C. Since at temperatures above the melting point of Si (1410° C.) the surface of the Si disk begins to melt, a corresponding process step should be conducted in a very short time so that the silicon disk cannot completely melt.

The substrate itself can have a thickness between 5 μm and 500 μm, especially between 50 μm and 330 μm, without a restriction of the theory of the invention having to take place.

The inorganic ceramic mss is in particular applied to the reverse side of a substrate of a solar cell.

Independently of this, preferably monocrystalline and/or multicrystalline silicon should be preferably used as a substrate. According to a further proposal, the substrate should be a solar cell of multicrystalline silicon which is manufactured according to the EFG method, or a photoactive layer of this.

Furthermore, the possibility exists through the theory of the invention that a doping of the substrate will take place as a function of the composition of the inorganic ceramic material during the heating process. Moreover, layers of desired conductivity can be selectively constructed, especially pn-transitions, which, for example, are connected up as protective diodes.

According to an independent solution proposal, the invention relates to a solar cell including photovoltaic layers which are distinguished in that one stabilization layer consisting of inorganic ceramic mass is arranged on the reverse side photovoltaic layer. Moreover the inorganic ceramic layer can consist of mixtures or individual components of silicon dioxide, aluminum, aluminum oxide, aluminum diboride, magnesium oxide, silicon nitride, lithium boride, sodium oxide, lithium oxide, ceric oxide, yttrium oxide, titanium dioxide, boron oxide, boron nitride, silicon carbide, metallurgical silicon or graphite or metals which easily form oxides, carbides, nitrides or borides, whereby an organic binder and especially sintering adjuvants are added to the individual components or their mixture.

Finally, the invention relates to the use of an inorganic ceramic material consisting of the individual components or a mixture of silicon dioxide, aluminum, aluminum oxide, aluminum diboride, magnesium oxide, silicon nitride, lithium boride, sodium oxide, lithium oxide, ceric oxide, yttrium oxide, titanium dioxide, boron oxide, boron nitride, silicon carbide, metallurgical silicon or graphite or metals which easily form oxides, carbides, nitrides or borides as the stabilization layer of a substrate in the form of a semiconductor layer or a layer system of silicon, germanium, gallium arsenide and/or cadmium telluride or one or more elements from group IV of the periodic system and/or combination semiconductors from groups III and V or II and VI of the periodic system, whereby the layer system has a thickness $d_s$ with 0.5 μm≦$d_s$≦500 μm.

BRIEF DESCRIPTION OF THE DRAWINGS

Further details, advantages and features of the invention will become apparent not only on the basis of the claims, the features to be inferred from these—by themselves and/or in combination—but also on the basis of the following description of embodiments to be inferred from the drawing, wherein:

DESCRIPTION OF THE PREFERRED EMBODIMENTS

In order to reinforce a flat, fragile substrate of semiconductor material in particular or containing this, a layer of economical material consisting of inorganic ceramic material is applied at least area-wise to the substrate and joined with the substrate. The theory of the invention will be described on the basis of a solar cell without a restriction supposed to take place hereby.

To reinforce a solar cell which can have even or uneven surfaces, an inorganic ceramic mass of mixtures or individual components of silicon dioxide, aluminum, aluminum oxide, aluminum diboride, magnesium oxide, silicon nitride, lithium boride, sodium oxide, lithium oxide, cerium oxide, yttrium oxide, titanium dioxide, boron oxide, boron nitride, silicon carbide, metallurgical silicon or graphite or mixtures from them is applied to the whole surface or area-wise. Nonetheless, there exists no restriction of the materials used thereby. Rather other ceramic materials or metals, which form oxides, carbides, nitrides or borides, can also be used. The appropriate materials are processed with organic binding agents such as polymers and adjuvants such as water to pastes or dispersions and/or gels, whereby reference is made to methods sufficiently known from the state of the art. A sinter adjuvant such as $FeO_2$, transmission metal oxides such as yttrium oxide, magnesium oxide, and iron oxide can also be added to the mixture.

An inorganic ceramic material manufactured in this way is then applied as layer 12 to a reverse side of a semiconductor disk 10, dried and subsequently, or in a later process sequence, sintered together or separately with any other necessary heat treatments during the manufacture of a solar cell. It is supposed to be a matter of a p-semiconductor with the semiconductor of the embodiment.

The layer 12 applied as a paste or dispersion is hardened by the heat treatment and forms a solid ceramic layer (which includes the semiconductor layer 10 as well as an n-layer 14) on the finished solar cell.

Of course, there also exists the possibility of providing a solar cell on the front side, the reverse side or on both sides with a corresponding ceramic material to construct, for example, a frame.

The finished cell is stabilized through the fixed ceramic layer 12 and protected against deformation or breakage with further mechanical stresses, which arise in the course of processing the solar cell.

Figure 1:
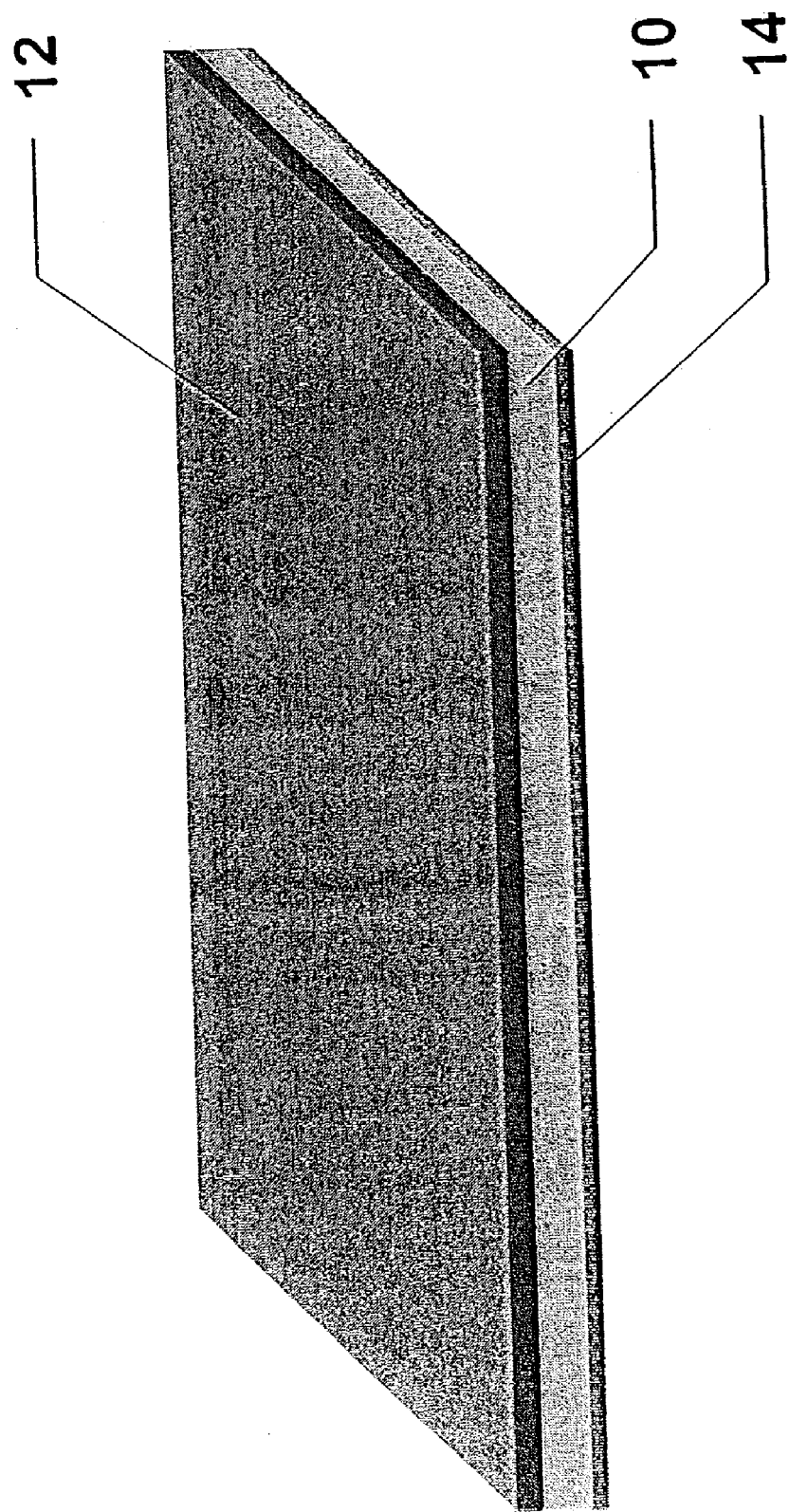
FIG. 1 Illustrates a main representation of a solar cell with a stabilization layer applied with its entire surface applied to the stabilization layer, FIG. 2 Illustrates a further embodiment of a solar cell with a stabilization layer installed on the edge of the disk, FIG. 3 Illustrates a third embodiment of a solar cell with stabilization layer installed on the reverse side of the disk, FIG. 4 Illustrates a solar cell with a stabilization layer with fabric reinforcement mounted in the edge region, FIG. 5 Illustrates a solar cell with a fabric-reinforced stabilization layer installed area-wise, FIG. 6 Illustrates a fabric with inorganic ceramic materials installed area-wise on this for assembling and further processing several disks.
Figure 2:
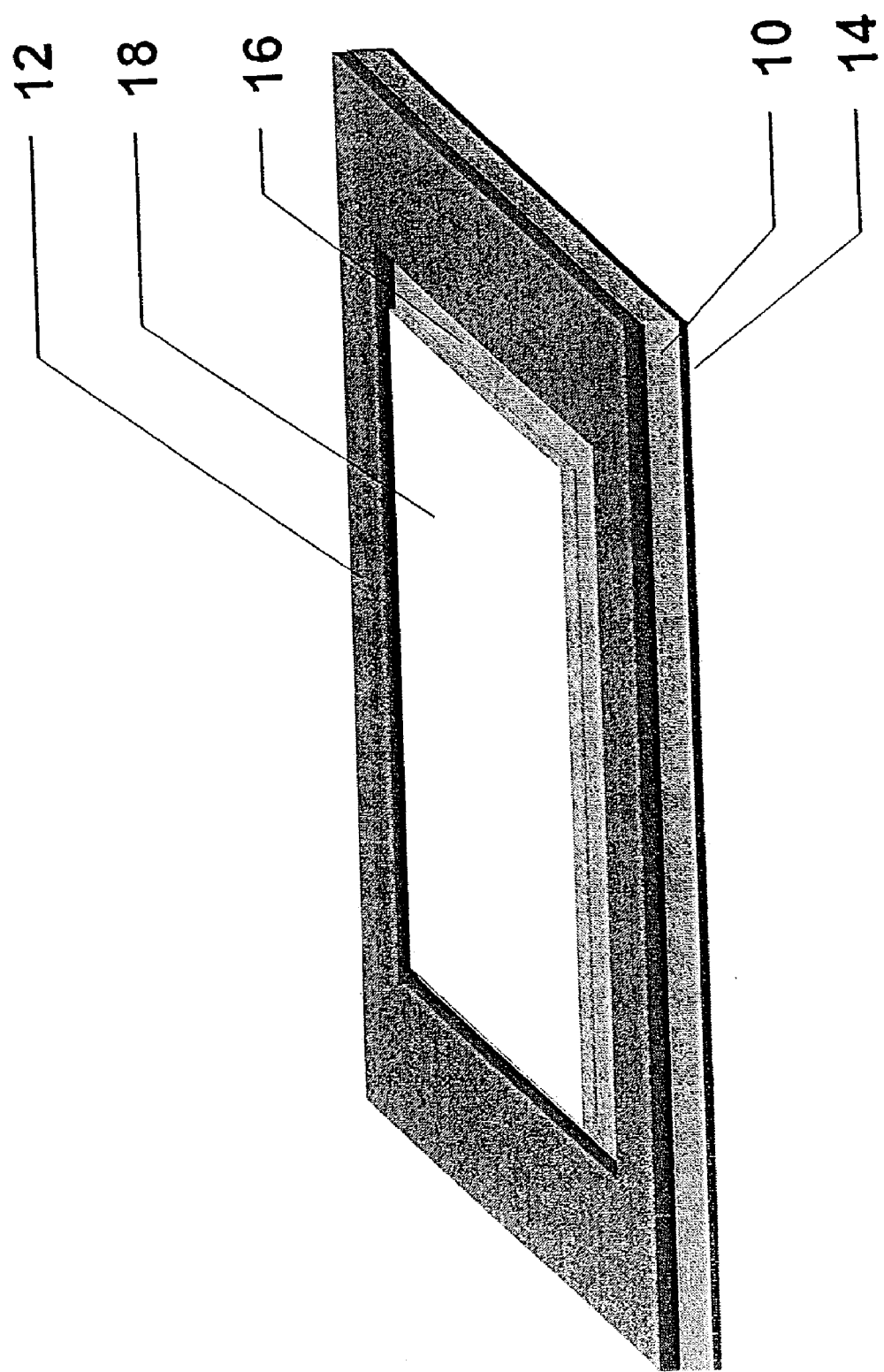

One or more recesses 16 are provided in accordance with the embodiment of FIG. 2 in layer 12, which increases the stability of the solar cell, to contact the solar cell enclosing the layers 10 and 14 on the reverse side into which one or more metallic contacts 18 for contacting the solar cell are arrangeable.

Desired reinforcement effects can be attained through suitable selection of the thickness of layer 12, which can vary locally, and through distribution of the layer on the solar cell or the recess 16 so that even very thin semiconductor disks attain suitable mechanical stability or a sufficiently stable form.

Applying layer 12 in the form of a ceramic paste or dispersion can also take place according to methods as they are to be inferred from the state of the art. Tampon printing, roller printing or screen-printing can be mentioned by way of example. Even spraying or spreading on is possible. With the latter, preferably dispersion is used instead of a paste.

To the extent that the inorganic ceramic material, for example, contains aluminum or its compounds, a doping in the layer (the p-layer 10 in the embodiment) can take simultaneously place in addition to mechanical stabilization. By suitable heat treatment in the hardening or sintering of layer 12, appropriate atoms or compounds diffuse into the semiconductor layer 10, owing to which a charge carrier layer is built up which, for example, acts as an electric reflector for negative minority charge carriers in semiconductor technology 10.

If donor elements, such as, for example, P, are introduced into the ceramic material, [these] can be diffused into the semiconductor layer by selective local application of inorganic ceramic material and hardening or sintering of these pn-transitions, which form a local diode structure and can be connected in as protective diodes.

The substrates provided with the organic ceramic material, such as silicon layer 10, preferably have thicknesses of less than 300 μm.

The layer 12, which consists of inorganic ceramic material, should have a thickness between 120 μm and 300 μm after heat treatment.

In addition, the layer 12 can have a greater thickness in the region of the edge, thus its corners, in order to form a so-called "protective frame." The layer 12 can have a thickness from, for example, 300 to 350 μm in the edge region and inside this, thus in the flat region, a thickness between 180 and 220 μm, to indicate numbers only as examples.

Figure 3:
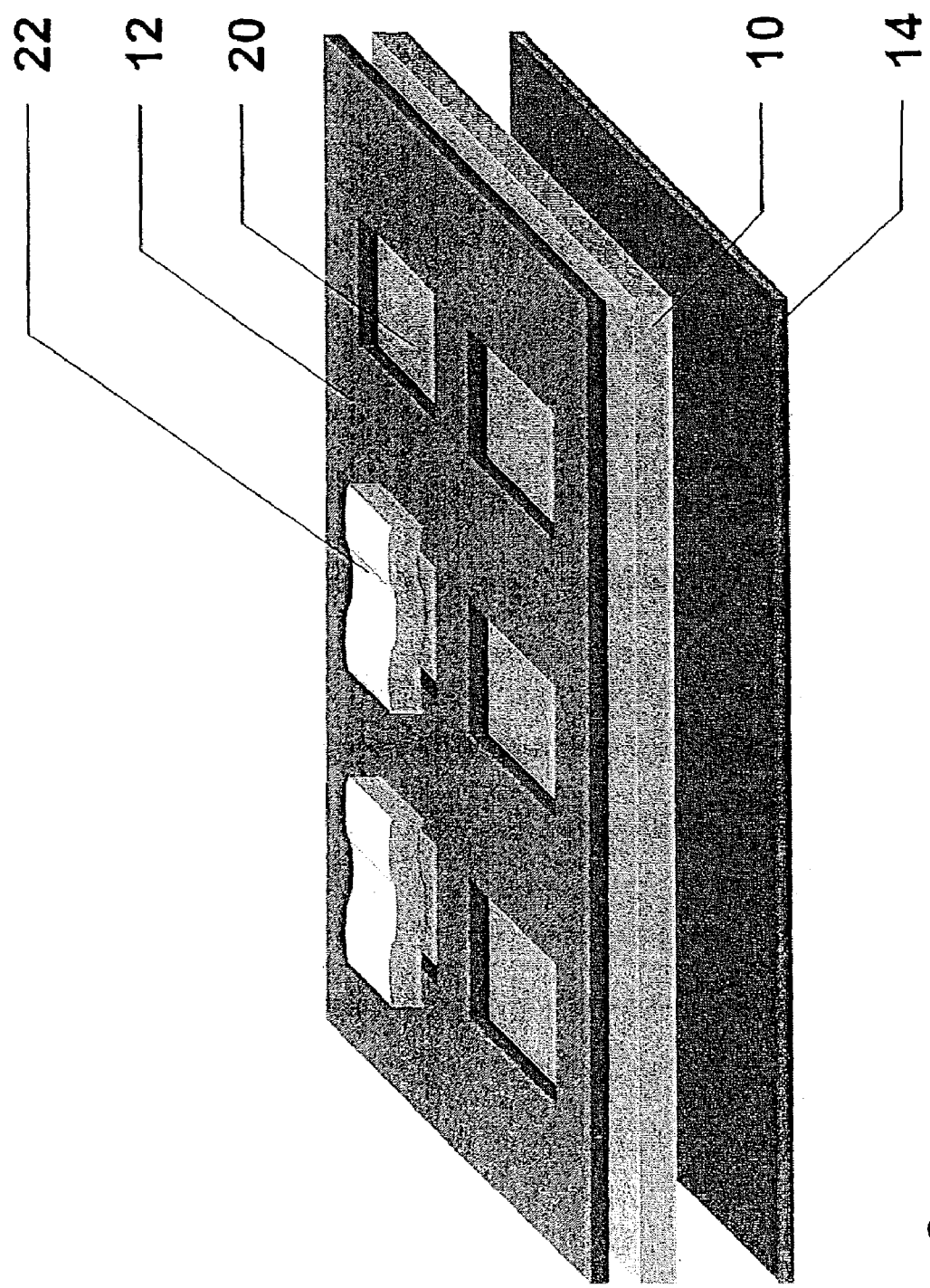

The embodiment of FIG. 3 differs from that of FIG. 2 in that layer 12 has several recesses 20 into which electrically conducting contacts 22 are introduced in order to make possible a reverse side contacting of the solar cell. Otherwise, the solar cell reproduced in exploded representation has the same structure, thus, in the embodiment, the p-layer 10, the n-layer 14 as well as the inorganic ceramic sintered partial layer 12 applied on the reverse side by heat treatment.

With respect to method, the inorganic ceramic layer 12 applied to the reverse side of layer 10 can first be applied as a paste in order subsequently to dry the unit so formed at a temperature in the range between 50° C. and 230° C. The sintering process proper takes subsequently place at a higher temperature, which can lie in the range between 750° C. and 950° C. The heat treatment can take place in the range between 750° C. and 950° C. over a period from 10 to 60 minutes as a function of the composition of the inorganic ceramic material and its thickness. During this time, the inorganic ceramic mass sinters together into a compact layer which acquires the desired stability. At the same time, a doping of layer 10 can take place as mentioned through the diffusion of, for example, boron or aluminum or its compounds from layer 12 into the semiconductor layer 10.

Figure 4:
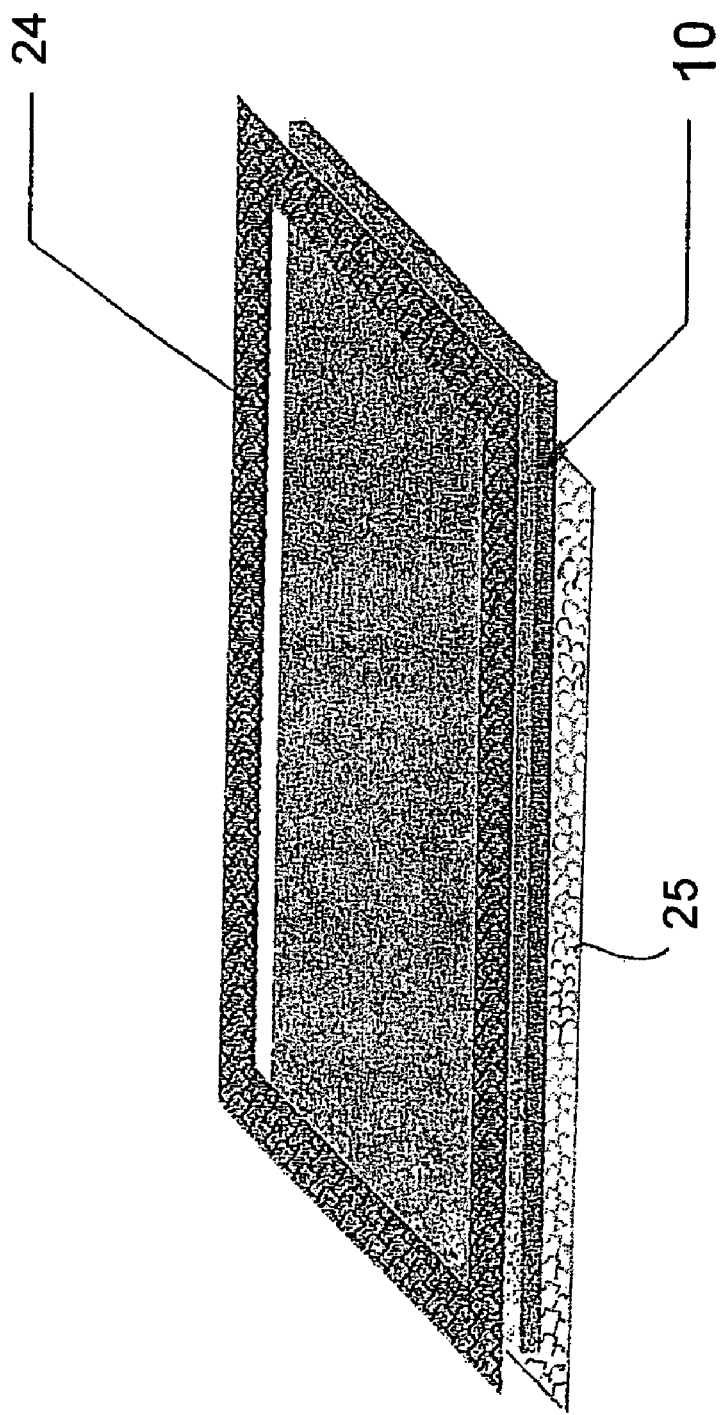

With the embodiment of FIG. 4, a fabric band 24 is positioned in the edge region of the semiconductor layer 10 to stabilize it which contains an inorganic ceramic material of previously reproduced composition, thus in particular a mixture or individual components of silicon dioxide, aluminum, aluminum oxide, aluminum diboride, magnesium oxide, silicon nitride, lithium boride, sodium oxide, lithium oxide, ceric oxide, yttrium oxide, titanium dioxide, boron oxide, boron nitride, silicon carbide, metallurgical silicon or graphite as well as organic binder and adjuvants such as water as well as in particular a sintering adjuvant.

The fabric band with the inorganic ceramic mass pressed onto layer 10 in the edge region, which almost forms a frame, is then dried in a pretreatment step at a temperature in the region of preferably 50° C. to 250° C., though which the fabric band 24 is glued to the edge of layer 10. subsequently, a further heat treatment at high temperature takes place, preferably in the range between 750° and 950° C. over a period between 10 and 60 minutes in air. Moreover, the inorganic ceramic mass sinters together into a compact layer as a function of temperature which bestows a desired stability upon layer 10 and the cell to be manufactured therewith. The fabric 24 reinforces the ceramic structure. At the same time, the inorganic ceramic material is applied sparingly to disk 10. Following heat treatment in air, a treatment in a reactive nitrogen atmosphere is also possible in which metallic silicon components are nitrided to $Si_3N_4$ (reaction nitriding). A layer 25 formed of ceramic material forms a frame around the front surface of the cell.

There also exists the possibility of conducting a heat treatment in an inert atmosphere in which organic fabric components are pyrolized into carbon fibers, which can react in the further course of the heat treatment, for example, to SiC.

Figure 5:
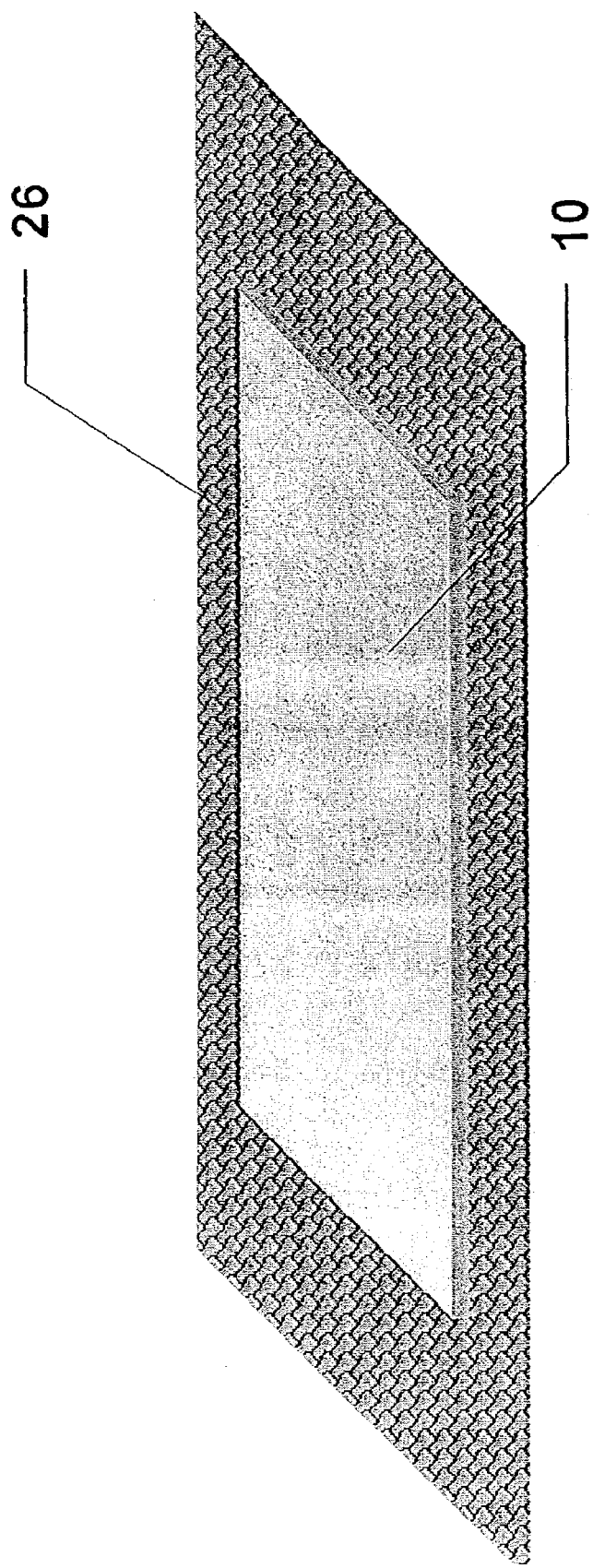

According to the embodiment of FIG. 5, a flat fabric 26 is positioned flat on the reverse side of disk or layer 10 or its edges are additionally bordered with a paste containing the inorganic ceramic material including organic adhesive components as well as sintering adjuvant in particular. A pretreatment step in the temperature range between 50° C. and 150° C. is added for drying the paste and gluing on the fabric. After this, the unit so processed is subjected to a further heat treatment at higher temperature, preferably in the range between 750° C. and 950° C. over a time from 10 to 60 minutes in air, nitrogen or an inert atmosphere. Moreover, the inorganic ceramic material sinters together into a compact layer as a function of temperature, which bestows desired stability upon layer 10 and the cell to be manufactured therewith.

Figure 6:
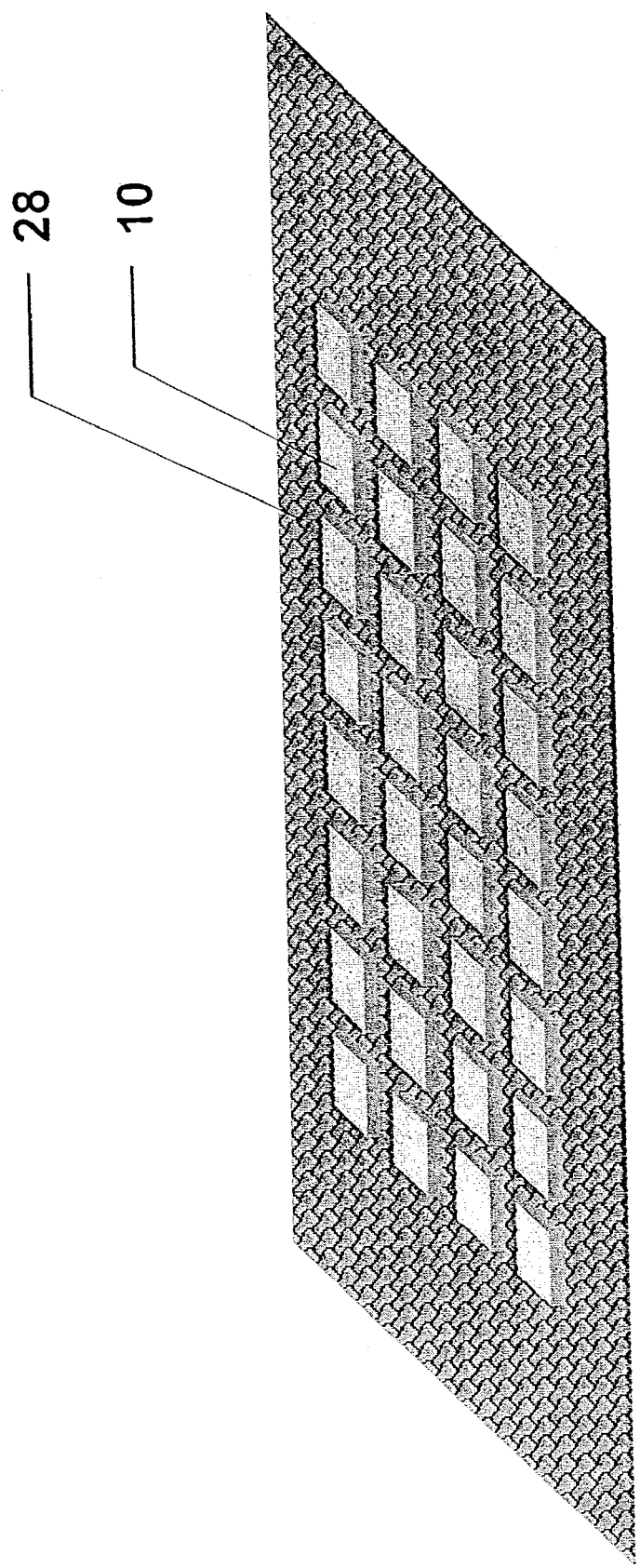

With the embodiment of FIG. 6, a large area fabric 28 is placed underneath a paste, which consists of the previously explained materials, thus simply expressed, of ceramic filler and organic adhesive components. The paste is indicated with gray shadowing in FIG. 6.

Several disks corresponding to disk 10 can be positioned on the paste-fabric unit. The edges of the disks can be additionally bordered with additional fabrics such as bands. Then drying the past as well as gluing on the fabric takes place in a pretreatment step. This pretreatment step is conducted preferably in a temperature range between 50° C. and 150° C. Subsequently, a so processed cell arrangement is subjected to a further heat treatment, and indeed in the range between preferably 750° C. and 950° C. over a period between 10 and 60 minutes. The heat treatment can moreover take place in air or in nitrogen or in an inert atmosphere. At the appropriate temperature, the ceramic material sinters into a compact layer through which the desired stability is bestowed upon the cells.

The embodiment of FIG. 6 makes possible a simultaneous processing of several disks, for example, on a conveyor belt. A product thus assembled can contribute to a subsequent module finishing for facilitating manufacturing steps as a basic form.

The invention claimed is:

1. Method for reinforcing against breakage a fragile flat semiconductor substrate of a solar cell having a front surface facing incident solar radiation, a back surface opposite to the front surface and an edge region, comprising the steps of:
applying an inorganic ceramic material to the back surface, leaving at least one space free of ceramic material for contacting the solar cell; and
subsequently heat treating the substrate with the inorganic ceramic material to sinter and harden the inorganic ceramic material;
wherein the inorganic ceramic material is applied to the substrate in such a thickness that after heat treatment the inorganic ceramic material forms a layer on the back surface of thickness d where: $10\ \mu m \leq d \leq 500\ \mu m$.

2. Method according to claim 1, wherein the inorganic ceramic material is applied using screen printing, tampon printing, stretching, spraying, or is positioned at least areawise on the substrate and then pressed onto the substrate.

3. Method according to claim 1, wherein the inorganic ceramic material is applied to form a lattice structure on the substrate.

4. Method according to claim 1, wherein $100\ \mu m \leq d \leq 300\ \mu m$.

5. Method according to claim 1, wherein the inorganic ceramic material is reinforced by a fabric, a metal wire or fibers.

6. Method according to claim 5, wherein the ceramic material is selected from the group consisting of $SiO_2$, SiC, C, and silicate.

7. Method according to claim 1, wherein organic fibers are applied to the back surface.

8. Method according to claim 7, wherein the organic fibers are polyethylene or polyurethane fibers.

9. Method according to claim 1, wherein the inorganic ceramic material after sintering has a coefficient of expansion corresponding to that of the substrate.

10. Method according to claim 1, wherein the heat treating takes place at a temperature $T_1$ where $600°\ C. \leq T_1 \leq 1650°\ C.$ 11. Method according to claim 10, wherein $750°\ C. \leq T_1 \leq 950°\ C.$ 12. Method according to claim 11, wherein the heat treating is performed by a laser beam.

13. Method according to claim 10, additionally comprising exposing the substrate provided with the inorganic ceramic material to a heat pretreatment at a temperature $T_2$ where $50°\ C. \leq T_2 \leq 500°\ C.$ 14. Method according to claim 13, wherein $100°\ C. \leq T_2 \leq 300°\ C.$ 15. Method according to claim 1, wherein the heat treatment comprises exposing the substrate to a temperature $T_1$ where $750°\ C. \leq T_1 950°\ C.$ over a period $t_1$ where $5\ min \leq t_1$ 100 min, or to a temperature T3 where $1200°\ C. \leq T_3 \leq 1650°\ C.$ over a period of time $t_3$ where $5\ \mu s\ t_3 \leq 10\ min.$ 16. Method according to claim 15, wherein $10\ min \leq t_1 \leq 60\ min$ and $10\ \mu s \leq t_3 \leq 60\ s.$ 17. Method according to claim 10, wherein the heat treating is performed by a laser beam.

18. Method according to claim 1, wherein the inorganic ceramic material is at least one material selected from the group consisting of silicon dioxide, alumirum, aluminum oxide, aluminum diboride, magnesium oxide, silicon nitride, lithium boride, sodium oxide, lithium oxide, ceric oxide, yttrium oxide, titanium dioxide, boron oxide, boron nitride, silicon carbide, metallurgical silicon, graphite, and metals forming ceramic oxides, carbides, nitrides or borides.

19. Method according to claim 1, wherein the inorganic ceramic material is a paste, a dispersion or a gel.

20. Method according to claim 1, wherein the substrate is selected from the group consisting of silicon, gallium arsenide, cadmium telluride, germanium, a semiconductor made from an element of group IV of the periodic system, and a combination semiconductors of including at least one element of group III, group IT and VI of the periodic table and ternary extensions thereof.

21. Method according to claim 1, wherein the substrate is a semiconductor disc.

22. Method according to claim 21, wherein the disc is at least one partially processed solar cell.

23. Method according to claim 1, wherein the substrate comprises at least one of monocrystalline and multicrystalline silicon.

24. Method according to claim 1, wherein the solar cell comprises at least one of monocrystalline and multicrystalline silicon.

25. Method according to claim 1, wherein the substrate is a solar cell of multicrystalline silicon which is manufactured by EFG (edge-defined film-fed growth).

26. Method according to claim 1, additionally comprising doping the substrate with the applied inorganic ceramic material and heat treating the applied material such that the substrate is doped, and optionally performing local doping in at least one of a front side, a back side and an edge region of the substrate.

27. Method according to claim 26, wherein substrate is doped such that a pntransition is constructed in the substrate.

28. Method according to claim 27, wherein pn-transition is a protective diode in the solar cell.

29. Method according to claim 1, wherein the ceramic material is applied as at least a partial frame on the back surface.

30. Method according to claim 1, additionally comprising applying the ceramic material to at least one of the front surface and the edge region.

31. Method according to claim 30, wherein the ceramic material is applied to the front surface to form with the ceramic material applied to the back surface, a frame around the cell.

* * * * *